United States Patent
Lee et al.

(10) Patent No.: US 9,236,471 B2
(45) Date of Patent: *Jan. 12, 2016

(54) SEMICONDUCTOR STRUCTURE AND METHOD FOR MANUFACTURING THE SAME

(71) Applicant: UNITED MICROELECTRONICS CORP., Hsinchu (TW)

(72) Inventors: Chiu-Te Lee, Zhubei (TW); Ke-Feng Lin, Taipei (TW); Shu-Wen Lin, Zhubei (TW); Kun-Huang Yu, New Taipei (TW); Chih-Chung Wang, Hsinchu (TW); Te-Yuan Wu, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/253,365

(22) Filed: Apr. 15, 2014

(65) Prior Publication Data

US 2014/0225192 A1    Aug. 14, 2014

Related U.S. Application Data

(63) Continuation-in-part of application No. 13/454,149, filed on Apr. 24, 2012, now Pat. No. 8,766,358.

(51) Int. Cl.
*H01L 29/76* (2006.01)
*H01L 29/78* (2006.01)
*H01L 29/40* (2006.01)
*H01L 29/06* (2006.01)
*H01L 29/08* (2006.01)

(52) U.S. Cl.
CPC ........ *H01L 29/7816* (2013.01); *H01L 29/0653* (2013.01); *H01L 29/407* (2013.01); *H01L 29/0878* (2013.01)

(58) Field of Classification Search
CPC ................ H01L 29/7816; H01L 29/66681; H01L 29/1095
USPC ........... 257/343, 334–335, 341; 438/270, 286
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |

(Continued)

*Primary Examiner* — Theresa T. Doan
(74) *Attorney, Agent, or Firm* — WPAT, PC; Justin King

(57) ABSTRACT

A semiconductor structure comprises a substrate having a first conductive type; a deep well having a second conductive type formed in the substrate; a first well having the first conductive type and a second well having the second conductive type both formed in the deep well and the second well spaced apart from the first well; a gate electrode formed on the substrate and disposed between the first and second wells; an isolation extending down from the surface of the substrate and disposed between the gate electrode and the second well; a conductive plug including a first portion and a second portion electrically connected to each other, and the first portion electrically connected to the gate electrode, and the second portion penetrating into the isolation. The bottom surface of the second portion of the conductive plug is covered by the isolation.

32 Claims, 6 Drawing Sheets

(56) References Cited

U.S. PATENT DOCUMENTS

| | | | |
|---|---|---|---|
| 5,326,711 | A | 7/1994 | Malhi |
| 5,346,835 | A | 9/1994 | Malhi |
| 5,430,316 | A | 7/1995 | Contiero |
| 5,436,486 | A | 7/1995 | Fujishima |
| 5,534,721 | A | 7/1996 | Shibib |
| 5,811,850 | A | 9/1998 | Smayling |
| 5,950,090 | A | 9/1999 | Chen |
| 5,998,301 | A | 12/1999 | Pham |
| 6,066,884 | A | 5/2000 | Krutsick |
| 6,144,538 | A | 11/2000 | Chao |
| 6,165,846 | A | 12/2000 | Carns |
| 6,245,689 | B1 | 6/2001 | Hao |
| 6,277,675 | B1 | 8/2001 | Tung |
| 6,277,757 | B1 | 8/2001 | Lin |
| 6,297,108 | B1 | 10/2001 | Chu |
| 6,306,700 | B1 | 10/2001 | Yang |
| 6,326,283 | B1 | 12/2001 | Liang |
| 6,353,247 | B1 | 3/2002 | Pan |
| 6,388,292 | B1 | 5/2002 | Lin |
| 6,400,003 | B1 | 6/2002 | Huang |
| 6,424,005 | B1 | 7/2002 | Tsai |
| 6,514,830 | B1 | 2/2003 | Fang |
| 6,521,538 | B2 | 2/2003 | Soga |
| 6,614,089 | B2 | 9/2003 | Nakamura |
| 6,713,794 | B2 | 3/2004 | Suzuki |
| 6,762,098 | B2 | 7/2004 | Hshieh |
| 6,764,890 | B1 | 7/2004 | Xu |
| 6,784,060 | B2 | 8/2004 | Ryoo |
| 6,784,490 | B1 | 8/2004 | Inoue |
| 6,819,184 | B2 | 11/2004 | Pengelly |
| 6,822,296 | B2 | 11/2004 | Wang |
| 6,825,531 | B1 | 11/2004 | Mallikarjunaswamy |
| 6,846,729 | B2 | 1/2005 | Andoh |
| 6,855,581 | B2 | 2/2005 | Roh |
| 6,869,848 | B2 | 3/2005 | Kwak |
| 6,894,349 | B2 | 5/2005 | Beasom |
| 6,958,515 | B2 | 10/2005 | Hower |
| 7,015,116 | B1 | 3/2006 | Lo |
| 7,023,050 | B2 | 4/2006 | Salama |
| 7,037,788 | B2 | 5/2006 | Ito |
| 7,075,575 | B2 | 7/2006 | Hynecek |
| 7,091,079 | B2 | 8/2006 | Chen |
| 7,148,540 | B2 | 12/2006 | Shibib |
| 7,214,591 | B2 | 5/2007 | Hsu |
| 7,309,636 | B2 | 12/2007 | Chen |
| 7,323,740 | B2 * | 1/2008 | Park et al. ............... 257/316 |
| 7,358,567 | B2 | 4/2008 | Hsu |
| 7,427,552 | B2 | 9/2008 | Jin |
| 8,766,358 | B2 * | 7/2014 | Lee et al. ............... 257/343 |
| 2003/0022460 | A1 | 1/2003 | Park |
| 2004/0018698 | A1 | 1/2004 | Schmidt |
| 2004/0070050 | A1 | 4/2004 | Chi |
| 2005/0227448 | A1 | 10/2005 | Chen |
| 2005/0258496 | A1 | 11/2005 | Tsuchiko |
| 2006/0035437 | A1 | 2/2006 | Mitsuhira |
| 2006/0261407 | A1 | 11/2006 | Blanchard |
| 2006/0270134 | A1 | 11/2006 | Lee |
| 2006/0270171 | A1 | 11/2006 | Chen |
| 2007/0041227 | A1 | 2/2007 | Hall |
| 2007/0082440 | A1 | 4/2007 | Shiratake |
| 2007/0132033 | A1 | 6/2007 | Wu |
| 2007/0273001 | A1 | 11/2007 | Chen |
| 2008/0160697 | A1 | 7/2008 | Kao |
| 2008/0160706 | A1 | 7/2008 | Jung |
| 2008/0185629 | A1 | 8/2008 | Nakano |
| 2008/0296655 | A1 | 12/2008 | Lin |
| 2009/0108348 | A1 | 4/2009 | Yang |
| 2009/0111252 | A1 | 4/2009 | Huang |
| 2009/0159966 | A1 | 6/2009 | Huang |
| 2009/0242981 | A1 * | 10/2009 | Fujita et al. ............... 257/335 |
| 2009/0278208 | A1 | 11/2009 | Chang |
| 2009/0294865 | A1 | 12/2009 | Tang |
| 2010/0006937 | A1 | 1/2010 | Lee |
| 2010/0032758 | A1 | 2/2010 | Wang |
| 2010/0096702 | A1 | 4/2010 | Chen |
| 2010/0148250 | A1 | 6/2010 | Lin et al. |
| 2010/0213517 | A1 | 8/2010 | Sonsky |
| 2011/0057263 | A1 | 3/2011 | Tang et al. |
| 2013/0075833 | A1 * | 3/2013 | Liu et al. ............... 257/411 |

\* cited by examiner

SEMICONDUCTOR STRUCTURE AND METHOD FOR MANUFACTURING THE SAME

This application is a continuation-in-part application of application Ser. No. 13/454,149 filed Apr. 24, 2012, the contents of which are incorporated herein by reference.

BACKGROUND

1. Technical Field

The disclosure relates in general to a semiconductor structure and a method for manufacturing the same, and more particularly to a semiconductor structure having conductive plug and a method for manufacturing the same, thereby simultaneously decreasing the on-resistance and increasing the breakdown voltage of the semiconductor structure.

2. Description of the Related Art

Reduction of feature size, improvements of the rate, the efficiency, the density and the cost per integrated circuit unit are the important goals in the semiconductor technology. With the development of semiconductor technology, high power devices have been applied to a variety of electronic products in different fields. Laterally diffused metal oxide semiconductor (LDMOS) or extended drain metal oxide semiconductor (EDMOS) is widely used in high voltage or high power PMIC (power management integrated circuit) application as the driving device.

On-resistance (Ron) is one of key factors of the semiconductor device. The lower the on-resistance or the specific on-resistance (Ron-sp), the lower the power consumption of the semiconductor device. Ron is a very important characteristic for the PMIC products, especially for the portable IC devices. Many improvements have been disclosed by modifying the structures of LDMOS or EDMOS devices; for example, changing the shape of STI or wells. However, Ron improvement is still limited on current LDMOS or EDMOS devices. No more than about 5% of improvement on the ratio of Ron to breakdown voltage (Ron/BVD) has been achieved by using well scheme or implant optimization.

SUMMARY

The disclosure is directed to a semiconductor structure and a method for manufacturing the same, which decreases the on-resistance of the semiconductor structure. The disclosure is particularly directed to a semiconductor structure comprising a conductive plug, simultaneously resulting in decrease of the on-resistance and increase of the breakdown voltage, thereby enhancing the characteristic of the device applied with the semiconductor structure.

According to an aspect of the disclosure, a semiconductor structure comprises a substrate having a first conductive type; a deep well having a second conductive type formed in the substrate and extending down from a surface of the substrate; a first well having the first conductive type formed in the deep well and extending down from the surface of the substrate; and a second well having the second conductive type formed in the deep well and extending down from the surface of the substrate, and the second well spaced apart from the first well; a gate electrode formed on the substrate and disposed between the first and second wells; an isolation extending down from the surface of the substrate and disposed between the gate electrode and the second well; a conductive plug including a first portion and a second portion electrically connected to each other, and the first portion electrically connected to the gate electrode, and the second portion penetrating into the isolation. The bottom surface of the second portion of the conductive plug is entirely covered by the isolation.

According to another aspect of the disclosure, a method of manufacturing semiconductor structure is provided, comprising: providing a substrate having a first conductive type; forming a deep well having a second conductive type in the substrate and extending down from a surface of the substrate; forming a first well having the first conductive type in the deep well and extending down from the surface of the substrate; forming a second well having the second conductive type in the deep well and extending down from the surface of the substrate, and the second well being spaced apart from the first well; forming an isolation extending down from the surface of the substrate and part of the isolation disposed in the second well; forming a gate electrode on the substrate and disposed between the first and second wells, and another part of the isolation beneath the gate electrode; and forming a conductive plug comprising a first portion and a second portion electrically connected to each other, and the first portion electrically connected to the gate electrode, and the second portion penetrating into the isolation. The bottom surface of the second portion of the conductive plug is entirely covered by the isolation.

DETAILED DESCRIPTION

Figure 1:
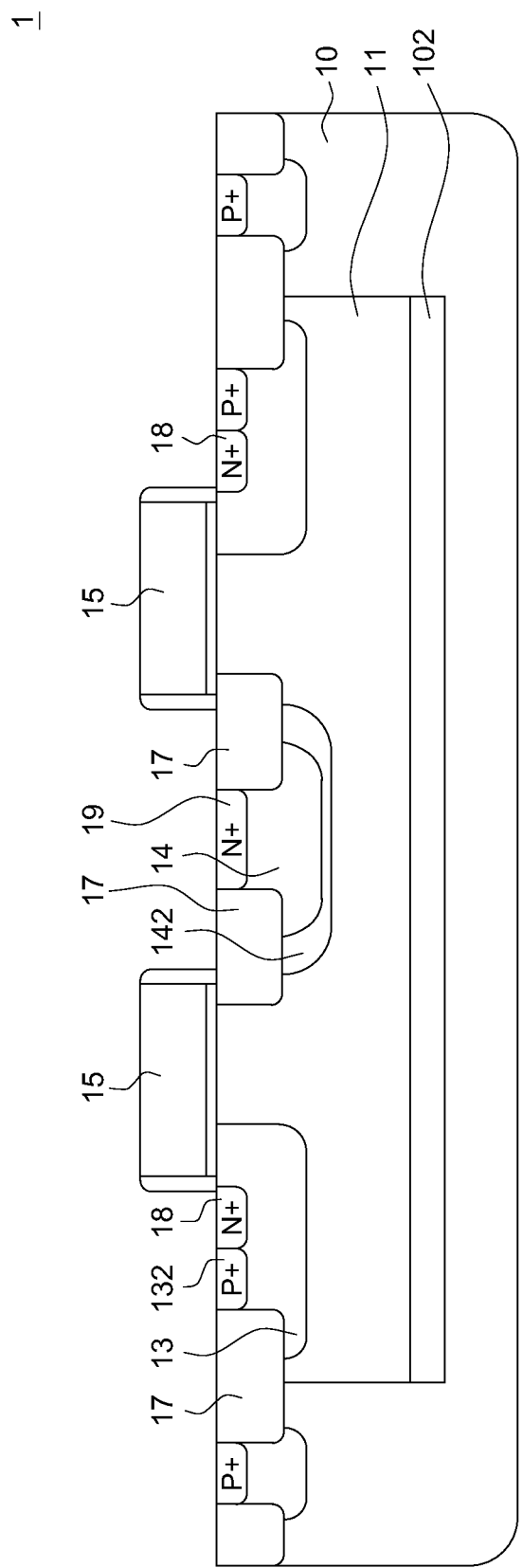
FIG. 1 illustrates a parallel-LDMOS device according to an embodiment of the disclosure.

The embodiments are described in details with reference to the accompanying drawings. The identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale.

FIG. 1 illustrates a parallel-LDMOS device according to an embodiment of the disclosure. The LDMOS device 1 includes a P-substrate 10, a N-deep well (NDW) 11, a heavily-doped n-buried layer (NBL) 102 formed in the P-substrate 10 and under the N-deep well 11, a P-well 13 and a N-well 14 formed in the N-deep well 11 by a distance, a gate electrode 15 formed on the P-substrate 10 and substantially between the P-well 13 and the N-well 14, and an isolation such as shallow trench isolation (STI) 17 substantially between the gate electrode 15 and the N-well 14. The LDMOS device 1 further includes two heavy N-doping regions respectively formed in the P-well 13 and the N-well 14, for being the source 18 and the drain 19 of the device. The gate electrode 15 and the drain 19 are separated by the STI 17. Also, a P-doping region 132 is formed in the P-well 13 and adjacent to the source 18 as a bulk. A P-well and a P+ region formed therein could be formed outside the N-deep well 11 as the guard ring as the edge termination for high voltage operation. Since the LDMOS device 1 is parallel-type, the left-side and right-side structures of the drain are constructed as a mirror image. The LDMOS device 1 of the embodiment varies the doping concentrations of wells near the drain, such as forming a HVN field 142 around the N-well 14 as shown in FIG. 1, and the drain 19, the N-well 14 and the HVN field 142 being implanted in an order from high to low doping concentrations, respectively. The LDMOS device 1 of the embodiment decreases the on-resistance, thereby improving the characteristics of LDMOS or EDMOS devices.

The embodiments as illustrated below provide semiconductor structures having conductive plugs and methods of manufacturing the same. The semiconductor structures of the embodiments not only decrease the On-resistance (Ron) but also increase the breakdown voltage of the devices, thereby efficiently improving the electrical characteristics of the devices.

Figure 2:
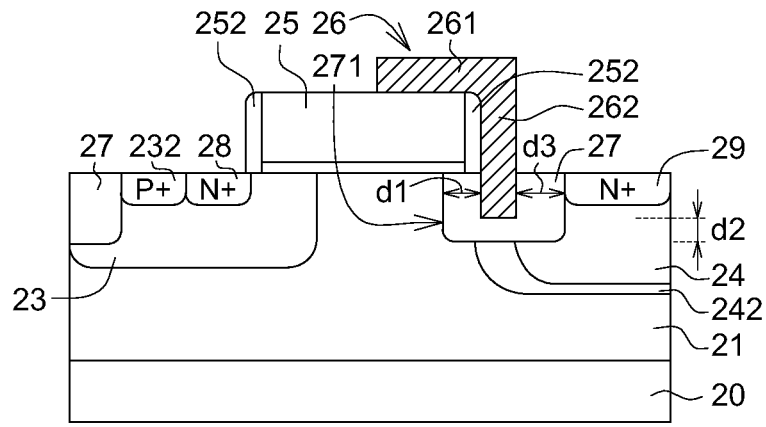
FIG. 2 is a partial drawing of a LDMOS device according to another embodiment of the disclosure.

FIG. 2 is a partial drawing of a LDMOS device according to another embodiment of the disclosure. The LDMOS device 2 of the embodiment includes a substrate 20 having a first conductive type (such as P-type); a deep well 21 having a second conductive type (such as N-type) formed in the substrate 20 and extending down from a surface of the substrate 20; a first well 23 having the first conductive type (such as P-type) and a second well 24 having the second conductive type (such as N-type) spaced apart from each other and formed in the deep well 21 by extending down from the surface of the substrate 20; a gate electrode 25 formed on the substrate 20 and disposed between the first well 23 and the second well 24; an isolation 27, such as an oxide or STI, extending down from the surface of the substrate 20 and substantially disposed between the gate electrode 25 and the second well 24. A first side wall 271 of the isolation 27 is disposed beneath the gate electrode 25, and part of the isolation is disposed in the second well 24. The LDMOS device 2 further includes a first doping electrode region 28 having the second conductive type formed within the first well 23 and extending down from the surface of the substrate 20; and a second doping electrode region 29 having the second conductive type formed within the second well 24 and extending down from the surface of the substrate 20. The isolation 27 is disposed between the gate electrode 25 and the second doping electrode region 29. The first doping electrode region 28 and the second doping electrode region 29 function as the source and the drain of the device, respectively.

Also, the LDMOS device 2 might include a field with the second conductive type such as a HVN field 242 around the second well 24, and the second doping electrode region 29, the second well 24, the HVN field 242 and the deep well 21 are implanted in an order from high to low doping concentrations, respectively.

The LDMOS device 2 of the embodiment further includes a conductive plug 26 comprising a first portion 261 and a second portion 262 electrically connected to each other, and the first portion 261 is electrically connected to the gate electrode 25, and the second portion 262 penetrates into the isolation 27. As shown in FIG. 2, the first portion 261 of the conductive plug 26 is disposed on the gate electrode 25 to contact the gate electrode 25, and a bottom surface of the second portion 262 of the conductive plug 26 is entirely covered by the isolation 27. Also, the conductive plug 26 is positioned outside the gate electrode 25, and the second portion 262 is formed along the lateral side of the gate electrode 25 as shown in FIG. 2. In one embodiment, the first portion 261 and the second portion 262 are formed as one integrated piece. The conductive plug 26 could be a tungsten plug, or a plug made of other conductive materials. No extra mask and photolithography step are required to manufacture the semiconductor structure of the embodiment. Configuration of the conductive plug 26 connected to the gate electrode 25 could be achieved at the contact formation process (by photo and etching steps) simultaneously.

As shown in FIG. 2, the second portion 262 of the conductive plug 26 is spaced apart from the first side wall 271 of the isolation 27 at a first distance d1. The first distance d1 is also defined as an extension length, which is the distance (i.e. partial length of the gate electrode 25 and the spacer 252) between the isolation 27 and the second portion 262. In one embodiment, the first distance d1 is in a range of 0.13 μm to 0.55 μm. The second portion 262 of the conductive plug 26 is spaced apart from a bottom surface of the isolation 27 at a second distance d2. In one embodiment, the second distance d2 is in a range of 0.1 μm to 0.3 μm; the ratio of the depth of the second portion 262 to the depth of the isolation 27 is in a range of 0.25 to 0.75. In one embodiment, the second portion 262 of the conductive plug 26 is spaced apart from the second doping electrode region 29 at a third distance d3. In one embodiment, the third distance d3 is in a range of 0.1 μm to 0.52 μm. However, the disclosure is not limited to those numerical ranges. The actual sizes of components in the conductive plug 26, such as the first distance d1, the second distance d2, the third distance d3, etc., could be adjusted according to the size of the device in practical applications, such as bottom width and insertion depth of the isolation 27.

Moreover, the isolation 27 of the embodiment could be a single layer or a combination of multi-layers including several insulating layers. The combination of multi-layers of the isolation 27 could be selected from SiO2, SiON, Si3N4, and materials with high dielectric constant. For example, the isolation 27 is a combination of the SiO2 layer and the Si3N4 layer, which the Si3N4 layer functions as an etch stop layer and facilitates controlling the second distance d2 precisely. Examples of materials with high dielectric constant include rare-earth (RE) oxides and lanthanide series metal oxides.

Figure 3:
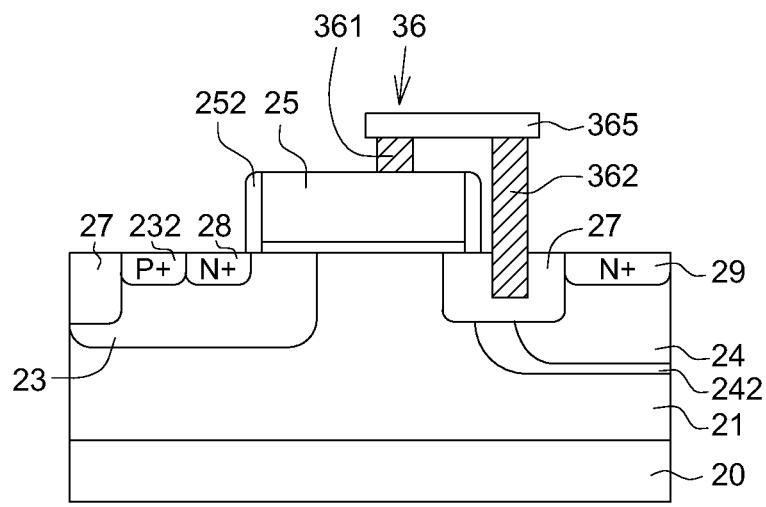
FIG. 3 is a partial drawing of a LDMOS device according to a further embodiment of the disclosure.

FIG. 3 is a partial drawing of a LDMOS device according to further embodiment of the disclosure. Structures of the LDMOS device 3 of FIG. 3 and the LDMOS device 2 of FIG. 2 are identical except configurations of the conductive plugs. The conductive plug 36 of the LDMOS device 3 includes the first portion 361, the second portion 362 and a conductive line 365. The first portion 361 of the conductive plug 36 is disposed on the gate electrode 25 and contacts the gate electrode 25. The second portion 362 of the conductive plug 36 is spaced apart from the gate electrode 25 at an interval, and penetrates into the isolation 27. The first portion 361 and the second portion 362 are electrically connected by the conductive line 365. Similarly, the bottom surface of the second portion 362 of the conductive plug 36 is entirely covered by the isolation 27.

Figure 4A:
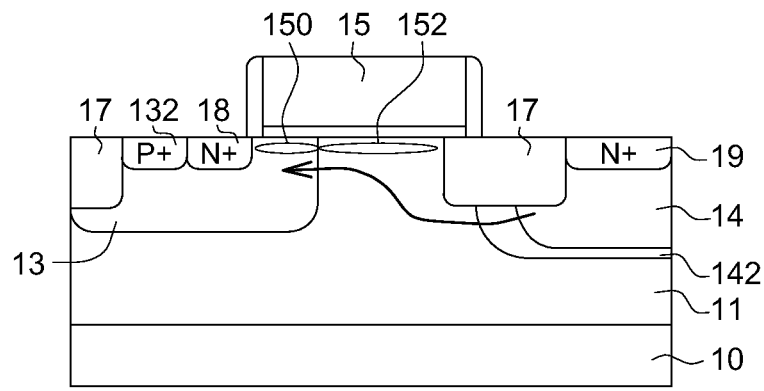
FIG. 4A and FIG. 4B respectively illustrate the current paths of the LDMOS devices of FIG. 1 and FIG. 2 of the embodiments during operation.
Figure 4B:
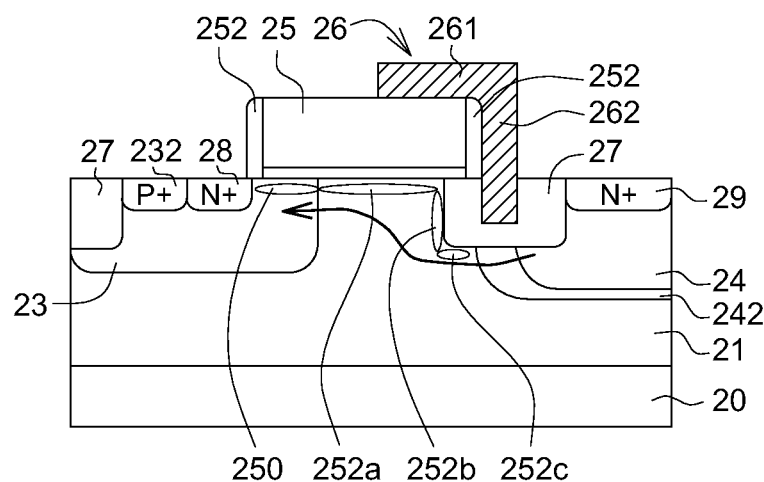

FIG. 4A and FIG. 4B respectively illustrate the current paths of the LDMOS devices of FIG. 1 and FIG. 2 of the embodiments during operation. The elements of FIG. 4A and FIG. 1 are designated with the same reference numerals. The elements of FIG. 4B and FIG. 2 are designated with the same reference numerals. In FIG. 4A, the LDMOS device includes a channel area 150 and a charge-accumulation area 152. If a positive bias is applied to the gate electrode 15, the negative charges accumulate in the charge-accumulation area 152. In FIG. 4B, the LDMOS device of the embodiment includes a channel area 250 and the charge-accumulation areas 252a, 252b and 252c. Compared to the LDMOS device of FIG. 4A, the charge-accumulation areas 252a-252c of the LDMOS device of the embodiment of FIG. 4B is longer due to the existence of the conductive plug 26 (i.e. the first portion 261 and the second portion 262). If a positive bias is applied to the gate electrode 25, the negative charges are distributed in the longer charge-accumulation areas 252a-252c and more close to drain side area, thereby reducing the resistance in the extended drain area. Accordingly, the on-resistance of the LDMOS device of FIG. 2 has been efficiently decreased, especially at the condition of low drain bias operation.

Figure 5A:
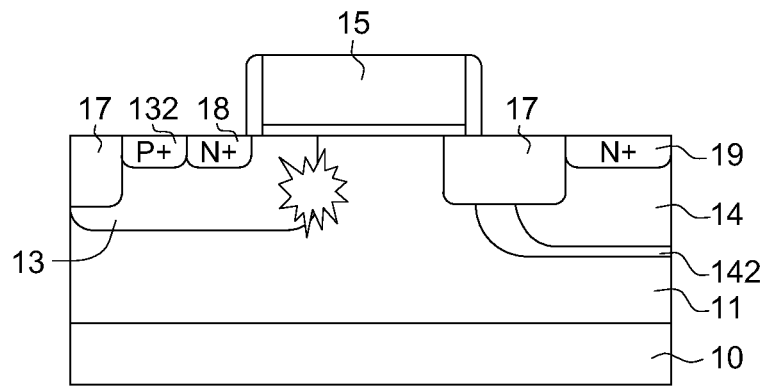
FIG. 5A and FIG. 5B respectively illustrate the breakdown occurrence of the LDMOS devices of FIG. 1 and FIG. 2 of the embodiments during operation.
Figure 5B:
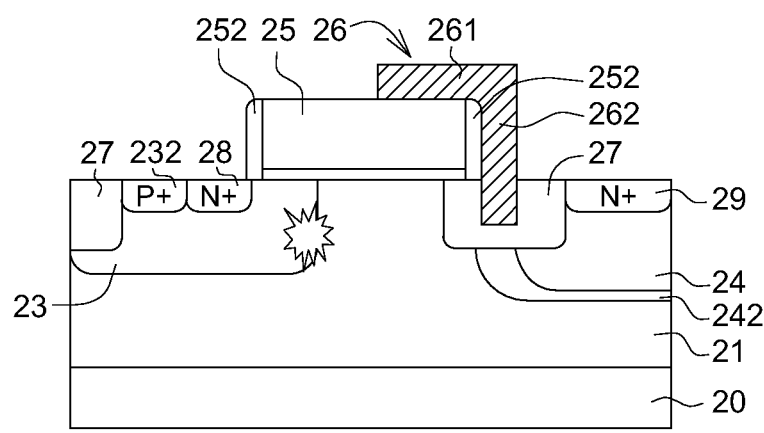

FIG. 5A and FIG. 5B respectively illustrate the breakdown occurrence of the LDMOS devices of FIG. 1 and FIG. 2 of the embodiments during operation. The elements of FIG. 5A and FIG. 1 are designated with the same reference numerals. The elements of FIG. 5B and FIG. 2 are designated with the same reference numerals. Breakdown will occur in lightly doped PN junctions, such as the boundaries between the P-type second wells 13, 23 and the N-type deep wells 11, 21 (i.e., positions of star symbols depicted in FIG. 5A and FIG. 5B). The critical value of the voltage, at which the breakdown of a P-N junction diode occurs is called the breakdown voltage. Since the LDMOS device of FIG. 2 has the conductive plug 26 as shown in FIG. 5B, the second portion 262 functions as a shielding plate, resulting in the re-distribution of the lines of electric force between the drain (i.e. the second doping electrode region 29) and the second well 23. Compared to the LDMOS device of FIG. 5A, the lines of electric force close to the PN junctions at which the breakdown occurs in FIG. 5B are not as dense as that in FIG. 5A, and the breakdown voltage of the device is enhanced due to the change of the electric field.

Figure 6C:
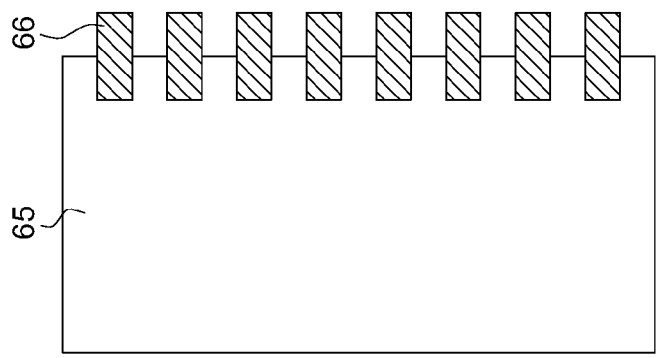
FIG. 6A, FIG. 6B and FIG. 6C simply illustrate the top views of three different types of the configurations of the conductive plug and gate electrode of the LDMOS devices according to the embodiments of the disclosure.
Figure 6B:
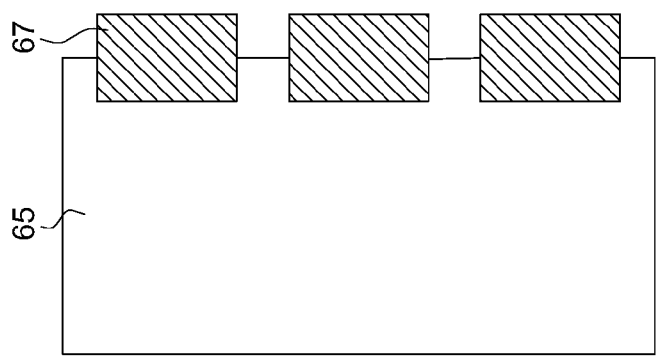
Figure 6A:
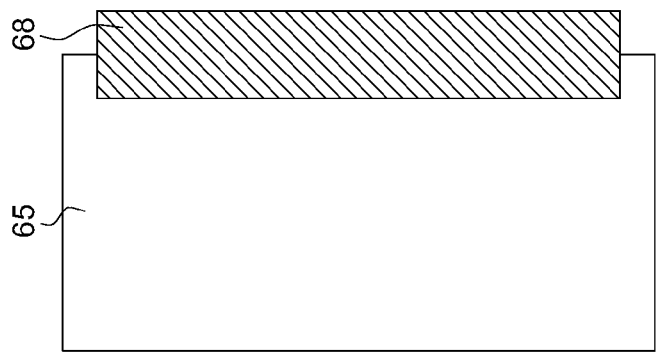

Additionally, configuration of the conductive plug and gate electrode could be varied depending on the actual needs of the applications. FIG. 6A, FIG. 6B and FIG. 6C simply illustrate the top views of three different types of the configurations of the conductive plug and gate electrode of the LDMOS devices according to the embodiments of the disclosure. As shown in FIG. 6A, the conductive plug could be configured as a pattern of dots 66 (ex: square shaped, rectangular, circular or the likes) separately formed on the gate electrode 65. As shown in FIG. 6B, the conductive plug could be configured as a pattern of rectangular blocks 67 separately formed on the gate electrode 65. As shown in FIG. 6C, the conductive plug could be configured as a long strip 68 formed on the gate electrode 65. It is, of course, noted that the configurations of FIG. 6A-FIG. 6C are depicted only for demonstration, not for limitation. It is known by people skilled in the art that the shapes of the top surface of the conductive plug and the area ratio of the conductive plug to the gate electrode could be adjusted according to the requirements and/or manufacturing method in the practical application.

Figure 7:
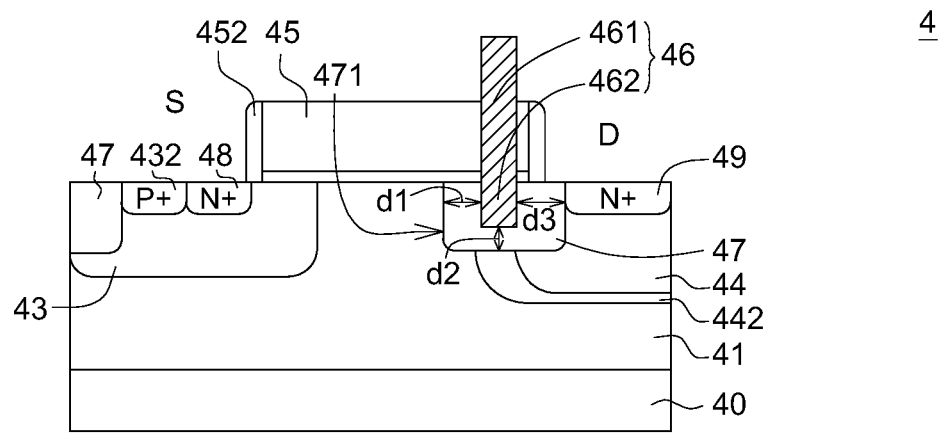
FIG. 7 is a partial drawing of a LDMOS device according to a still further embodiment of the disclosure.

FIG. 7 is a partial drawing of a LDMOS device according to a still further embodiment of the disclosure. Structures of the LDMOS device 4 of FIG. 7 and the LDMOS device 2 of FIG. 2 are identical except configurations of the conductive plugs. The LDMOS device 4 of the embodiment as shown in FIG. 7 reinforces the structure of the gate connected conductive plug.

As shown in FIG. 7, the LDMOS device 4 includes a substrate 40 having a first conductive type (such as P-type); a deep well 41 having a second conductive type (such as N-type) formed in the substrate 40 and extending down from a surface of the substrate 40; a first well 43 having the first conductive type (such as P-type) and a second well 44 having the second conductive type (such as N-type) spaced apart from each other and formed in the deep well 41 by extending down from the surface of the substrate 40; a gate electrode 45 formed on the substrate 40 and disposed between the first well 43 and the second well 44; an isolation 47 (such as an oxide or STI) extending down from the surface of the substrate 40 and substantially disposed between the gate electrode 45 and the second well 44. A first side wall 471 of the isolation 47 is disposed beneath the gate electrode 45, and part of the isolation is disposed in the second well 44. The LDMOS device 4 further includes a first doping electrode region 48 having the second conductive type (ex: N+) formed within the first well 43 and extending down from the surface of the substrate 40; and a second doping electrode region 49 having the second conductive type (ex: N+) formed within the second well 44 and extending down from the surface of the substrate 40. The isolation 47 is disposed between the gate electrode 45 and the second doping electrode region 49. The first doping electrode region 48 and the second doping electrode region 49 function as the source (S) and the drain (D) of the device, respectively.

Also, the LDMOS device 4 might include a field with the second conductive type such as a HVN field 442 around the second well 44, and the second doping electrode region 49, the second well 44, the HVN field 442 and the deep well 41 are implanted in an order from high to low doping concentrations, respectively.

The LDMOS device 4 of the embodiment further includes a conductive plug 46 comprising a first portion 461 and a second portion 462 electrically connected to each other. The conductive plug 46 could be a tungsten plug, or a plug made of other conductive materials. The first portion 461 is disposed within the gate electrode 45 and electrically connected to the gate electrode 45, and the second portion 462 penetrates into the isolation 47, wherein a bottom surface of the second portion 462 of the conductive plug 46 is entirely covered by the isolation. According to the embodiment, the first portion 461 of the conductive plug 46 is disposed within the gate electrode 45 to directly contact the gate electrode 45. As shown in FIG. 7, the first portion 461 penetrates through the gate electrode 45, and the second portion 462 is extended from the first portion 461. In one embodiment, the first portion 461 and the second portion 462 substantially constitute a straight plug, and are formed as one integrated piece. Also, the first portion 461 of the conductive plug 46 can be projected from a top surface of the gate electrode 45, as depicted in FIG. 7. Alternatively, the first portion 461 of the conductive plug 46 can be substantially aligned with a top surface of the gate electrode 45.

Similarly, the second portion 462 of the conductive plug 46 is spaced apart from the first side wall 471 of the isolation 47 at a first distance d1. The second portion 462 of the conductive plug 46 is spaced apart from a bottom surface of the isolation 47 at a second distance d2. In one embodiment, the ratio of the depth of the second portion 462 to the depth of the isolation 47 is in a range of 0.25 to 0.75. The second portion 462 of the conductive plug 46 is spaced apart from the second doping electrode region 49 at a third distance d3. The actual sizes of the first distance d1, the second distance d2, the third distance d3 of the conductive plug 46 could be adjusted according to the size of the device in practical applications, such as bottom width and insertion depth of the isolation 47.

Furthermore, the conductive plug 46 penetrating into the gate electrode 45 can be configured as a pattern of separate dots (ex: square shaped, rectangular, circular or the likes), or a pattern of separate rectangular blocks or a pattern of separate rectangular blocks formed within the gate electrode 45. The configuration of the conductive plug 46 can be varied depending on the actual needs of the applications. Also, no extra mask and photolithography step are required to manufacture the semiconductor structure of the embodiment. Configuration of the conductive plug 46 connected to the gate electrode 45 could be achieved at the contact formation process (by photo and etching steps) simultaneously.

Figure 8:
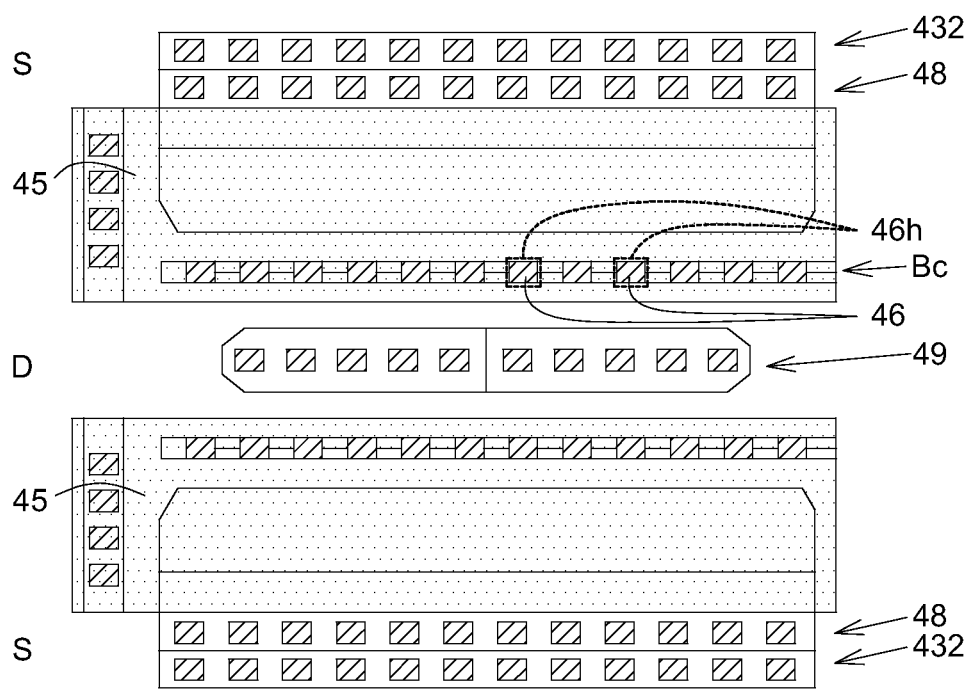
FIG. 8 simply illustrates a top view of a LDMOS device according to one of the still further embodiments of the disclosure.

FIG. 8 simply illustrates a top view of a LDMOS device according to one of the still further embodiments of the disclosure. FIG. 8 shows the positions of the gate electrode 45, the source (S), the drain (D) and the conductive plug 46 penetrating into the gate electrode 45 and the isolation 47 beneath the gate electrode 45. In one embodiment, plural poly holes 46h and the contacts at the source (S) and the drain (D) can be defined simultaneously. No extra mask and photolithography step are required to manufacture the semiconductor structure of the embodiment. Tungsten or other conductive material is then filled into the poly holes 46h to form the conductive plug 46. The poly holes 46h can be arranged linearly in the gate electrode 45. In one embodiment, the poly holes 46h are positioned at a contact bar $B_C$, wherein the contact bar $B_C$ is near one side of the gate electrode 45. Shapes and sizes of the cross-sectional areas of the poly hole 46h and contacts at the source (S) and the drain (D) can be identical or different. In one embodiment, the cross-sectional areas of the poly holes 46h and contacts at the source (S) and the drain (D) have the same shape and size, as shown in FIG. 8. It is, of course, noted that the configuration of FIG. 8 is depicted only for demonstration, not for limitation. It is known by people skilled in the art that the shapes of the top surface of the conductive plug 46 and the area ratio of the conductive plug 46 to the gate electrode 45 can be adjusted according to the requirements and/or manufacturing method in the practical application.

Relative Experiments

In the embodiment, the characteristics of semiconductor structure would be affected by the depth of the second portion 262 inserting the isolation 27. Variations of the distance (i.e. the first distance d1) between the second portion 262 and the first side wall 271 of the isolation 27 have effects on not only the on-resistance but also the breakdown voltage of the device.

Several exemplary devices are provided for conducting related simulation, and the results of measurements are listed in Table 1. Please also refer FIG. 2 for the structures of exemplary devices having the conductive plugs (Split 1-1-Split 3-2). The depth and width of the isolation 27 are about 0.4 μm and 0.75 μm, respectively. Please also refer FIG. 1 for the device without conductive plug (BSL) for comparison. Take three devices of Split 1-1-Split 1-3, for example, the first distances d1 of the conductive plugs in three exemplary devices are 0.55 μm, 0.15 μm and 0.13 μm, respectively. Other dimensions of the conductive plugs, such as bottom widths and insertion depths, are listed in Table 1. The breakdown voltages of three exemplary devices (Split 1-1-Split 1-3) are 41V, 43V and 44.8V, respectively. The specific on-resistances (Ron-sp, mohm×mm$^2$) of three exemplary devices (Split 1-1-Split 1-3) are 26.44, 25.29 and 24.40, respectively. The ratios of specific on-resistance to breakdown voltage (Ron-sp/BVD) of three exemplary devices (Split 1-1-Split 1-3) are 0.64, 0.59 and 0.54, respectively. Take measurement results of BSL as the reference base, values of Ron-sp of three exemplary devices (Split 1-1-Split 1-3) have been decreased to 1%, 5% and 9%, respectively. Also, values of breakdown voltages of three exemplary devices (Split 1-1-Split 1-3) have been increased to 17%, 23% and 28%, respectively. Ratios of Ron-sp/BVD of three exemplary devices (Split 1-1-Split 1-3) have been increased up to 15%, 23% and 28%, respectively.

Table 1 lists structural dimension and simulation results of several exemplary devices.

TABLE 1

|  | Conductive plug Depth (μm) | Conductive plug Width (μm) | First distance (d1), μm | VT (V) | IDL (mA) | IDS (mA) | BVD (V) |
| --- | --- | --- | --- | --- | --- | --- | --- |
| Comparison (BSL) | 0 | 0 | 0 | 0.72 | 0.259 | 8.45 | 35.1 |
| Split 1-1 | 0.3 | 0.1 | 0.55 | 0.72 | 0.262 | 8.35 | 41 |
| Split 1-2 | 0.3 | 0.1 | 0.15 | 0.72 | 0.274 | 8.47 | 43 |
| Split 1-3 | 0.3 | 0.1 | 0.13 | 0.72 | 0.284 | 8.64 | 44.8 |
| Split 2-1 | 0.1 | 0.1 | 0.15 | 0.72 | 0.258 | 8.65 | 36.0 |
| Split 2-2 | 0.2 | 0.1 | 0.15 | 0.72 | 0.264 | 8.58 | 39.0 |
| Split 2-3 | 0.3 | 0.2 | 0.15 | 0.72 | 0.277 | 8.39 | 44.0 |
| Split 2-4 | 0.3 | 0.3 | 0.15 | 0.72 | 0.280 | 8.32 | 42.0 |
| Split 3-1 | 0.3 | 0.2 | 0.13 | 0.72 | 0.287 | 8.56 | 45.5 |
| Split 3-2 | 0.3 | 0.3 | 0.13 | 0.72 | 0.291 | 8.48 | 43.0 |

|  | Enhanced BVD (%) | Ron-sp (mohm × mm$^2$) | Improved Ron-sp (%) | Ron-sp/BVD ratio | Improved Ron-sp/BVD (%) |
| --- | --- | --- | --- | --- | --- |
| Comparison (BSL) | 0 | 26.75 | 0 | 0.76 | 0 |
| Split 1-1 | 17% | 26.44 | 1% | 0.64 | 15% |
| Split 1-2 | 23% | 25.29 | 5% | 0.59 | 23% |
| Split 1-3 | 28% | 24.40 | 9% | 0.54 | 28% |
| Split 2-1 | 3% | 26.85 | 0 | 0.75 | 2% |

TABLE 1-continued

| Split 2-2 | 11% | 26.24 | 2% | 0.67 | 11% |
| Split 2-3 | 25% | 25.01 | 6% | 0.57 | 25% |
| Split 2-4 | 20% | 24.74 | 8% | 0.59 | 22% |
| Split 3-1 | 30% | 24.14 | 10% | 0.53 | 30% |
| Split 3-2 | 23% | 23.80 | 11% | 0.55 | 27% |

Accordingly, the conductive plug comprises the first portion electrically connected to the gate electrode, and the second portion penetrates into the isolation, wherein a bottom surface of the second portion of the conductive plug is entirely covered by the isolation. The conductive plug can be positioned outside the gate electrode (ex: the second portion 262 formed along the lateral side of the gate electrode 25 as shown in FIG. 2, or spaced apart from the lateral side of the gate electrode 25 as shown in FIG. 3), and also can be positioned within the gate electrode (ex: the conductive plug 46 penetrating through the gate electrode 45 and into the isolation 47 as shown in FIG. 7). According to the aforementioned descriptions, the semiconductor structure of the embodiments decreases the on-resistance; in particular, the semiconductor structure having conductive plug of the embodiments not only decreases the on-resistance and lowers the power consumption, but also increase the breakdown voltage of the semiconductor structure. There is an efficiently decrease of the ratio of Ron/BVD. For PMIC (power management integrated circuit) application, especially for the portable IC devices, the characteristic and performance of the products applied with the structure of the embodiment have been greatly improved. Moreover, the structure with conductive plug according to the embodiment could be implemented without changing the device pitch and the manufacturing method thereof is compatible with current process. Therefore, the structure of the embodiment is feasible for mass production. Also, the devices applied with the structure of the embodiment possess high competitiveness in the commercial market.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor structure, comprising:
a substrate having a first conductive type;
a deep well having a second conductive type, formed in the substrate and extending down from a surface of the substrate;
a first well having the first conductive type, extending down from the surface of the substrate and formed in the deep well;
a second well having the second conductive type, extending down from the surface of the substrate and formed in the deep well, and the second well spaced apart from the first well;
a gate electrode, formed on the substrate and disposed between the first and second wells;
an isolation, extending down from the surface of the substrate and disposed between the gate electrode and the second well;
a conductive plug, comprising:
a first portion, electrically connected to the gate electrode; and
a second portion, electrically connected to the first portion and penetrating into the isolation, wherein a bottom surface of the second portion of the conductive plug is entirely covered by the isolation.

2. The semiconductor structure according to claim 1, wherein the second portion of the conductive plug is spaced apart from a first side wall of the isolation beneath the gate electrode at a first distance.

3. The semiconductor structure according to claim 2, wherein the first distance is in a range of 0.13 μm to 0.55 μm.

4. The semiconductor structure according to claim 1, wherein the second portion of the conductive plug is spaced apart from a bottom surface of the isolation at a second distance.

5. The semiconductor structure according to claim 4, wherein the second distance is in a range of 0.1 μm to 0.3 μm.

6. The semiconductor structure according to claim 4, wherein a ratio of a depth of the second portion to a depth of the isolation is in a range of 0.25 to 0.75.

7. The semiconductor structure according to claim 1, further comprising:
a first doping electrode region having the second conductive type, extending down from the surface of the substrate and formed within the first well.

8. The semiconductor structure according to claim 1, further comprising:
a second doping electrode region having the second conductive type, extending down from the surface of the substrate and formed within the second well, the second doping electrode region functioning as a drain contact a lateral side of the isolation, and the lateral side of the isolation is vertical to the surface of the substrate, and the isolation is disposed between the gate electrode and the second doping electrode region.

9. The semiconductor structure according to claim 8, wherein the second portion of the conductive plug is spaced apart from the second doping electrode region at a third distance.

10. The semiconductor structure according to claim 9, wherein the third distance is in a range of 0.1 μm to 0.52 μm.

11. The semiconductor structure according to claim 1, wherein the first portion of the conductive plug is disposed on the gate electrode and contacts the gate electrode.

12. The semiconductor structure according to claim 11, wherein the first portion and the second portion of the conductive plug are formed as one integrated piece.

13. The semiconductor structure according to claim 11, wherein the second portion of the conductive plug is spaced apart from the gate electrode at an interval, and the first portion and the second portion are electrically connected by a conductive line.

14. The semiconductor structure according to claim 1, wherein the isolation is a single layer or a combination of multi-layers.

15. The semiconductor structure according to claim 14, wherein the isolation is a shallow trench isolation (STI) or an oxide.

16. The semiconductor structure according to claim 14, wherein the isolation comprises multi-layers selected from SiO2, SiON, Si3N4, and materials with high dielectric constant.

17. The semiconductor structure according to claim 16, wherein said materials with high dielectric constant are selected from rare-earth (RE) oxides and lanthanide series metal oxides.

18. The semiconductor structure according to claim 1, wherein the first portion is disposed within the gate electrode and penetrates through the gate electrode, and the second portion is extended from the first portion.

19. The semiconductor structure according to claim 18, wherein the first portion and the second portion substantially constitute a straight plug, and are formed as one integrated piece.

20. The semiconductor structure according to claim 18, wherein the first portion is projected from a top surface of the gate electrode.

21. The semiconductor structure according to claim 18, wherein the first portion is substantially aligned with a top surface of the gate electrode.

22. A method of manufacturing a semiconductor structure, comprising:
providing a substrate having a first conductive type;
forming a deep well having a second conductive type in the substrate and extending down from a surface of the substrate;
forming a first well having the first conductive type in the deep well and extending down from the surface of the substrate;
forming a second well having the second conductive type in the deep well and extending down from the surface of the substrate, and the second well being spaced apart from the first well;
forming an isolation extending down from the surface of the substrate and part of the isolation disposed in the second well;
forming a gate electrode on the substrate and disposed between the first and second wells, and another part of the isolation beneath the gate electrode; and
forming a conductive plug comprising a first portion and a second portion electrically connected to each other, and the first portion electrically connected to the gate electrode, and the second portion penetrating into the isolation, wherein a bottom surface of the second portion of the conductive plug is entirely covered by the isolation.

23. The method according to claim 22, further comprising:
forming a first doping electrode region having the second conductive type within the first well and extending down from the surface of the substrate.

24. The method according to claim 22, further comprising:
forming a second doping electrode region having the second conductive type within the second well and extending down from the surface of the substrate, the second doping electrode region functioning as a drain contact a lateral side of the isolation, and the lateral side of the isolation is vertical to the surface of the substrate, and the isolation being disposed between the gate electrode and the second doping electrode region.

25. The method according to claim 22, wherein the first portion of the conductive plug is disposed on the gate electrode and contacts the gate electrode.

26. The method according to claim 25, wherein the first portion and the second portion of the conductive plug are formed as one integrated piece.

27. The method according to claim 25, wherein the second portion of the conductive plug is spaced apart from the gate electrode at an interval, and the method of forming the conductive plug further comprises step of forming a conductive line to electrically connect the first portion and the second portion.

28. The method according to claim 22, wherein the isolation is a single layer or a combination of multi-layers.

29. The method according to claim 22, wherein the first portion is disposed within the gate electrode and penetrates through the gate electrode, and the second portion is extended from the first portion.

30. The method according to claim 29, wherein the first portion and the second portion substantially constitute a straight plug, and are formed as one integrated piece.

31. The method according to claim 29, wherein the first portion is projected from a top surface of the gate electrode.

32. The method according to claim 29, wherein the first portion is substantially aligned with a top surface of the gate electrode.

* * * * *